Aug. 18, 1970 F. D. CLARK 3,525,052

DISTORTION CANCELLING CIRCUIT FOR AMPLIFIERS

Filed May 13, 1968

Farnsworth D. Clark
INVENTOR.

BY Clarence A. O'Brien
and Harvey B. Jacobson
Attorneys

United States Patent Office 3,525,052

Patented Aug. 18, 1970

3,525,052

DISTORTION CANCELLING CIRCUIT FOR AMPLIFIERS

Farnsworth D. Clark, 534 N. Chambers, Galesburg, Ill., 61401

Filed May 13, 1968, Ser. No. 728,453
Int. Cl. H03f 1/26
U.S. Cl. 330—149 10 Claims

ABSTRACT OF THE DISCLOSURE

Harmonic distortion in the signal reproduced through a multistage amplifier due to nonlinearity of the amplifier tubes, is reduced by comparing the input signal level with a fraction of the output signal level equal to the reciprocal of the amplifier gain in order to produce a compensating signal added to the amplified signal between the stages of the amplifier.

This invention relates to the suppression or reduction in signal distortion experienced when reproducing audio frequency or D.C. signals through multistage amplifiers.

Many compensating or correcting circuits have been devised for use with amplifiers in order to improve signal reproduction by reducing distortion caused by different conditions. Very often, such signal compensating circuits are designed to eliminate noise above a predetermined level, cancel interference pulses or correct for operating instability due to temperature changes. Some of such correction circuits include a degenerative feedback arrangement with a consequential loss in power. The signal correcting circuit of the present invention on the other hand while generally directed to the signal distortion problem, deals with a specific cause of the problem, namely, the non-linearity in the gain of the amplifier tubes of a multistage audio frequency amplifier.

Thus, the distortion cancelling circuit of the present invention is specifically designed to reduce harmonic distortion resulting from nonlinearity of amplifier tubes in a multistage amplifier and does so without any degenerative feedback. Toward this end, the input signal to the amplifier is also fed to a subtracting signal detector for comparison with a correcting signal derived from the output of the amplifier. A compensating signal is thereby obtained which is equal and opposite in phase to an imaginery signal which if added to the input signal would produce the distortion in the output of the amplifier. This compensating signal is applied to the first stage amplifier for amplification with the input signal. The correcting signal with which the input signal is compared in order to produce the compensating signal, is adjusted to a signal level substantially equal to the reciprocal of the gain of the amplifier.

These together with other objects and advantages which will become subsequently apparent reside in the details of construction and operation as more fully hereinafter described and claimed, reference being had to the accompanying drawings forming a part hereof, wherein like numerals refer to like parts throughout, and in which:

FIG. 1 graphically illustrates the signal distortion problem with which the present invention is concerned.

Figure 2:
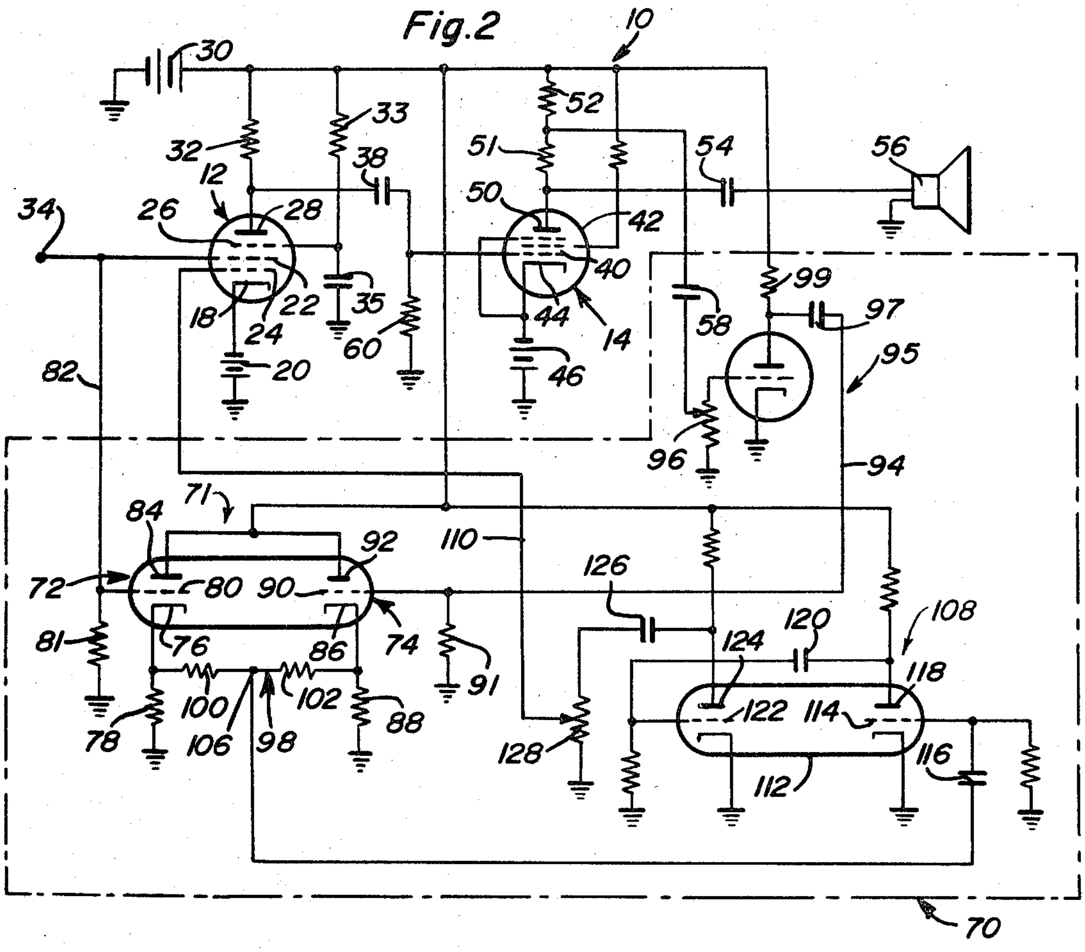
FIG. 2 is an electrical circuit diagram illustrating one embodiment of the invention which includes a signal distortion cancelling circuit in combination with a multistage audio frequency amplifier.
Figure 3:
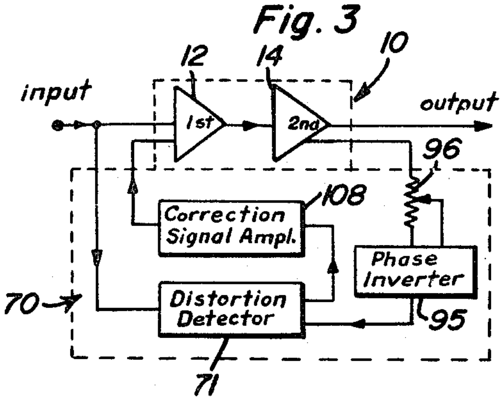
FIG. 3 is a schematic diagram corresponding to the distortion cancelling circuit illustrated in FIG. 2.

With reference to the drawings, FIGS. 2 and 3 illustrate a typical multistage, audio amplifier of the resistance-capacitance coupled type generally referred to by reference numeral 10. In the example shown, the amplifier stages consisting of the input stage 12 and output stage 14 are of the class A type selected principally because the output voltage of each stage is substantially a direct function of the input voltage for accurate signal reproduction. The input stage 12 includes a pentode 16 having a cathode 18 connected to a grounded source of negative bias 20 from which electrons are impelled by an input grid 22 and a second distortion control grid 24. A screen grid 26 is also positioned between input grid 22 and output plate 28. Plate bias is applied to the output plate from a positive voltage source 30 through a load resistor 32 while a separate bias is established for the screen grid through resistor 33 from its juncture with grounded capacitor 35. Accordingly, an input signal voltage applied from the input source 34 to the grid 22 of the pentode 16 will produce an amplified output voltage at the plate 28. The amplified voltage signal from the input stage 12 is fed through the interstage coupling capacitor 38 to the input grid 40 of the second stage pentode 42 having a cathode 44 connected to a grounded source of bias 46. A screen grid 47 and a suppressor grid 48 are positioned between the input grid and an output plate 50 of the second stage tube 42. Plate bias from source 30 is applied through bias resistor 51 and load resistor 52 to the plate coupled by capacitor 54 to a suitable load such as an output speaker 56. The bias on the grid 40 of the output stage 14 is controlled by the grounded grid resistor 60. Thus, an amplified output signal is obtained at the plate 50 of the second stage tube 42 at a gain of 100:1 for example relative to the input signal voltage supplied to the input source 34.

Figure 1:
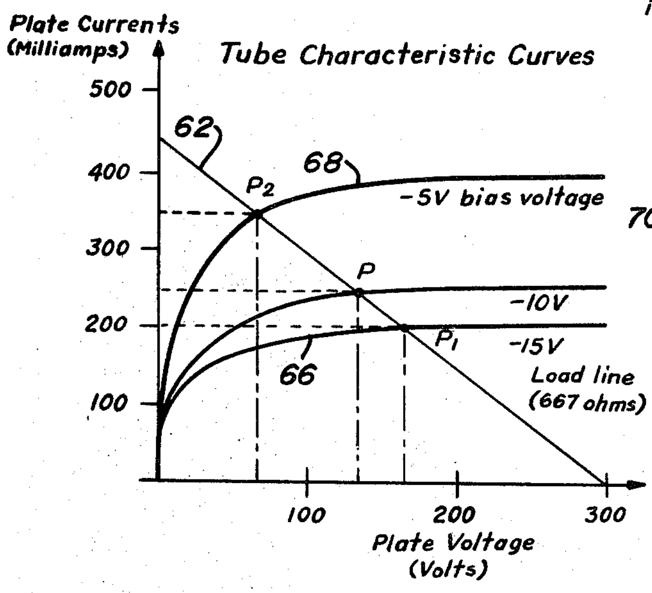

Although the output signal voltage of such a multistage amplifier is substantially a magnified replica of the input grid voltage to the input stage of the amplifier, a certain amount of distortion in the output signal does occur because the tube characteristics are such that the gain of the amplifier is not a perfect linear function of the signal input voltage. FIG. 1 for example, shows typical tube characteristic curves in which plate current is plotted against plate voltage for different grid bias voltages. For a given load as depicted by the load line 62, tube characteristic curve 64 corresponding to a negative grid voltage of 10 volts intersects the load line at point P corresponding to a plate current of approximately 250 volts. The tube characteristic curve 66 corresponding to a negative grid voltage of 15 volts, produces a plate current of 200 milliamps as depicted at point $P_1$. Accordingly, a 5 volt change in the grid voltage in one direction produces a change in plate current of 50 milliamps. However, a 5 volt change in grid voltage in the other direction as depicted by the point $P_2$ where curve 68 intersects the load line 62, produces a change in plate current of 100 milliamps. The foregoing is an exaggerated example of the nonlinearity of an amplifier tube within a predetermined operating range. This nonlinearity produces a harmonic distortion in the amplified output signal. In order to correct this condition, a multistage amplifier such as the amplifier 10 illustrated in FIG. 2 is connected to a distortion cancelling circuit generally referred to by reference numeral 70.

The distortion cancelling circuit includes a cathode follower distortion detector 71 having two triode tube sections 72 and 74. Tube section 72 is provided with a cathode 76 connected to ground through a load resistor 78 and an input grid 80 having a grounded grid resistor 81 and connected by conductor 82 to the input grid 22 of the input amplifier stage 12. A plate 84 is also associated with the tube section 72. The other tube section 74, similarly includes a cathode 86 connected to ground through a load resistor 88, an input grid 90 and a plate 92 connected with plate 84 of tube section 72 to the bias source. The grid 90 has a grounded grid resistor 91 and is connected by conductor 94 to the output of a phase inverter 95 through capacitor 97. The phase inverter includes a triode having a grounded cathode, a grid connected to ground through the resistance of a monitoring potentiometer 96 and a plate connected to the bias source through bias resistor 99. The variable resistance tap of potentiometer 96 is connected to the juncture between resistors 51 and 52 in the output amplifier 14 through the signal coupling capacitor 58. The monitoring potentiometer 96 is adjusted to a position so as to apply a fraction of the phase inverted output signal voltage of the amplifier 10 to the grid 90. This fraction is substantially equal to the reciprocal of the nominal amplifier gain. Accordingly, a signal voltage of proper phase is applied to the input grid 90 to be compared with the signal input voltage applied to the input stage of the amplifier 10 which is simultaneously applied to the grid 80 in the distortion cancelling circuit.

The output cathodes 76 and 86 of the two section detector tube 72–74 are interconnected by a compensating bridge circuit generally referred to by reference numeral 98 in order to produce an error signal voltage based upon the difference between the input signal voltage to the amplifier and the correction signal voltage derived from the output of the amplifier through the monitoring potentiometer 96. Thus, the output cathodes are interconnected by voltage distributing resistors 100 and 102 for establishing a voltage at the junction 106 that is amplified by a correction signal amplifier 108 to produce a compensating voltage opposite in phase to an imaginary voltage which added to the signal input voltage in amplifier stage 12 would produce the distortion condition. This compensating voltage is applied to the control grid 24 through conductor 110 from the correction signal amplifier 108. It is significant to note at this point, that the compensating voltage is not applied directly to the input of the amplifier as in the case of feedback arrangements.

The correction signal amplifier 108 includes a two section triode tube 112 having an input grid 114 connected through coupling capacitor 116 to the juncture 106 of the bridge circuit 98 associated with the detector tube 72–74. The signal applied to grid 114 is amplified at plate 118 coupled by capacitor 120 to the other control grid 122 of tube 112. An amplified signal of proper phase accordingly appears at the plate 124. The output of tube 112 is connected through capacitor 126 to a signal level adjusting potentiometer 128 from which the compensating signal voltage is applied through conductor 110 to tne input stage 12 of the amplifier 10.

So long as the monitoring potentiometer 96 is adjusted to the correct setting and the gain of the detector 71 together with amplifier 108 is somewhat greater than that of the amplifier stage 12, any distortion in the amplified reproduction of the signal input to the amplifier will be substantially cancelled or significantly reduced. While there may be some distortion in the cancelling circuit 70 itself, at the signal levels likely to be handled, this distortion should be small as compared to the distortion normally associated with the amplifier circuit. For this reason the cathode follower type detector 71 is utilized but since it has an inherent gain of less than one, its output is amplified and by amplifier 108. Assuming the output of amplifier 10 at any instant is more positive than it should be, the positive signal at the phase inverter 95 produces a negative output fed to the input grid 90 of the detector 71. Since this negative voltage is excessive, it will not be balanced by the input voltage applied to grid 80 so as to produce a negative output at juncture 106. This negative voltage output of the distortion detector is then amplified by amplifier 108 to feed a compensating signal to grid 24 of tube 16. The balanced condition of detector 71 is thereby restored as distortion in the amplifier is cancelled.

The foregoing is considered as illustrative only of the principles of the invention. Further, since numerous modifications and chanegs will readily occur to those skilled in the art, it is not desired to limit the invention to the exact construction and operation shown and described, and accordingly all suitable modifications and eauivalents may be resorted to.

What is claimed as new is as follows:

1. In combination with a signal amplifier having a plurality of series connected stages including an input stage and a signal amplifying output stage producing an output signal at a gain which is a nonlinear function of an input signal, means for reducing signal distortion in the output signal due to the nonlinearity of said gain, comprising output monitoring means operatively connected to the amplifier for producing a correction signal at a level which is a phase inverted fraction of said output signal, a subtracting signal detector directly connected to the input stage of the amplifier and the output monitoring means for comparing said input and correction signals, and correction circuit means connecting the signal detector to the amplifier for establishing a compensating signal applied to the input stage of the amplifier which is proportional and opposite in phase to the difference between said input and correction signals.

2. The combination of claim 1 wherein said fraction of the output signal is substantially equal to the reciprocal of the nominal gain of the amplifier.

3. The combination of claim 2 wherein said signal distortion reducing means has a gain greater than the gain of said input stage of the amplifier.

4. The combination of claim 1 wherein said signal distortion reducing means has a gain greater than the gain of said input stage of the amplifier.

5. The combination of claim 1 wherein said signal detector is of the cathode follower type.

6. The combination of claim 1 wherein said input stage of the amplifier includes an input electrode to which the input signal is applied and a distortion control electrode connected to the circuit means from which said compensating signal is applied for amplification with the input signal through the input and output stages of the amplifier.

7. The combination of claim 6 wherein said output stage includes a power amplifier device to which the output monitoring means is connected, said output monitoring means including a phase inverter connected to the subtracting signal detector.

8. The combination of claim 1 wherein said output stage includes a power amplifier device to which the output monitoring means is connected, said output monitoring means including a phase inverter connected to the subtracting signal detector.

9. In combination with a signal voltage amplifier having an input stage and an output stage producing an output voltage at a predetermined nominal gain relative to the input stage, means for reducing harmonic distortion of an input signal due to nonlinearity of said amplifier stages comprising adjustable resistance means connected to the output stage of the amplifier for establishing a signal correction voltage at a fraction of the output voltage substantially equal to the reciprocal of said nominal gain of the amplifier, a distortion detector having a pair of input electrodes and output electrodes, means connecting one of the input electrodes to the input stage for receiving the input voltage, phase inverting means connecting the other of the input electrodes to the adjustable resistance means for receiving said signal correction voltage therefrom, and compensating circuit means connecting said output electrodes to the amplifier for adding an amplified signal voltage equal and opposite in phase to an imaginary voltage which if added to the input signal would substantially produce said harmonic distortion.

10. The combination of claim 9 wherein said distortion detector is of the cathode follower type and signal correcting amplifier means connecting the compensating circuit means to the input stage of the amplifier, said input stage including a signal input grid and a control grid connected to the signal correcting amplifier means.

References Cited

UNITED STATES PATENTS 2,708,717 5/1955 Holmes et al. ------ 328—162 X

FOREIGN PATENTS 537,558 6/1941 Great Britain.
1,278,671 11/1961 France.

ROY LAKE, Primary Examiner

J. B. MULLINS, Assistant Examiner

U.S. Cl. X.R.

328—162